(12) United States Patent
Miller et al.

(10) Patent No.: US 6,877,150 B1
(45) Date of Patent: Apr. 5, 2005

(54) METHOD OF TRANSFORMING SOFTWARE LANGUAGE CONSTRUCTS TO FUNCTIONAL HARDWARE EQUIVALENTS

(75) Inventors: Ian D. Miller, Charlotte, NC (US); Stephen G. Edwards, Woodbine, MD (US); Jonathan C. Harris, Ellicott City, MD (US); James E. Jensen, Ellicott City, MD (US); Andreas B. Kollegger, Baltimore, MD (US); Christopher R. S. Schanck, Marriottsville, MD (US); Conor C. Wu, Elkridge, MD (US)

(73) Assignee: Xilinx, Inc., San Jose, CA (US)

( * ) Notice: Subject to any disclaimer, the term of this patent is extended or adjusted under 35 U.S.C. 154(b) by 159 days.

(21) Appl. No.: 10/310,520

(22) Filed: Dec. 4, 2002

(51) Int. Cl.[7] .............................................. G06F 17/50
(52) U.S. Cl. ............................................ 716/18; 716/3
(58) Field of Search ............................... 716/1, 3–4, 18

(56) References Cited

U.S. PATENT DOCUMENTS 6,324,680 B1 * 11/2001 Barnfield et al. ............. 716/18
6,701,501 B2 * 3/2004 Waters et al. ................... 716/3

OTHER PUBLICATIONS

U.S. Appl. No. 10/310,260, filed Dec. 4, 2002, Edwards et al.
U.S. Appl. No. 10/310,336, filed Dec. 4, 2002, Harris et al.
U.S. Appl. No. 10/310,362, filed Dec. 4, 2002, Edwards et al.

* cited by examiner

*Primary Examiner*—Vuthe Siek
*Assistant Examiner*—Paul Dinh
(74) *Attorney, Agent, or Firm*—Pablo Meles; LeRoy D. Maunu

(57) ABSTRACT

A method of designing an integrated circuit using a general purpose programming language can include identifying (105) a number of instances of each class allocated in a programmatic design implemented using the general purpose programming language and modeling (110) the global memory of the programmatic design. A data flow between the modeled global memory and instructions of the programmatic design which access object fields can be determined (115) and access to the modeled global memory can be scheduled (120). The programmatic design can be translated (125) into a hardware description of the integrated circuit using the modeled global memory, the data flow, and the scheduled memory access.

49 Claims, 8 Drawing Sheets

METHOD OF TRANSFORMING SOFTWARE LANGUAGE CONSTRUCTS TO FUNCTIONAL HARDWARE EQUIVALENTS

BACKGROUND OF THE INVENTION

1. Field of the Invention

The present invention relates to the field of hardware design and, more particularly, to generating a hardware description from a high level programming language.

2. Description of the Related Art

The design of field programmable gate arrays (FPGAS) or application specific integrated circuits (ASICS) typically begins with the development and validation of an algorithm which the integrated circuit (IC) is intended to implement. Presently, developers validate algorithmic designs by implementing algorithms in a high level programming language such as C, C++, Java, or the like. High level programming languages provide designers with the ability to rapidly prototype an algorithm, explore the algorithm in further detail, and ultimately prove or validate that the algorithm can sufficiently process the data for which the algorithm and the IC are being developed.

Once an algorithm has been validated, the designer can begin the process of transforming the high level language design into a hardware description implementation using VERILOG, VHDL, or some other hardware description language alternative. Presently, this transformation is performed manually by designers. As a result, the process can be very time intensive and prone to error. Transformation of a high level language design to a hardware description language implementation involves tracking an extraordinary number of inter-relationships between timing signals and data. The designer must think in terms of clock cycles and relative timing between signals in the hardware description language. State machines must be designed that are capable of correctly moving data through the hardware description language code, and which are capable of enabling the correct subsystems at the proper times.

Attempts have been made to develop improved tools to aid in the transition from a high level language design to a hardware description language design. For example, specialized programming languages such as Handel-C and SystemC are enhanced programming languages that, when compiled, can produce a hardware description conforming to a particular hardware description language specification such as VERILOG or VHDL. Specialized programming languages such as these, however, are "hardware aware" in that the languages include significant enhancements in the way of standard libraries and extensions which allow programs to be compiled into suitable hardware descriptions.

Handel-C, SystemC, and other "hardware aware" languages rely on a technique known as progressive elaboration. Under the technique of progressive elaboration, a designer codes a design in a high level language. After initial algorithmic verification, the designer successively adds more information and/or hardware aware constructs to the code to direct the compiler in terms of implementation. A final design is achieved by adding sufficient information to the source code to generate the desired results.

While "hardware aware" languages do help to automate the translation of validated algorithms to hardware description language designs, there are disadvantages to the use of specialized languages. One such disadvantage is the time required for developers to familiarize themselves with a different special purpose language. Although "hardware aware" languages typically are rooted in a known high level language such as the C programming language, developers still must learn special enhancements and additions to the language which make the generation of a hardware description language output possible.

Another disadvantage of specialized "hardware aware" languages can be the cost associated with purchasing the language as a design tool. The acquisition of a specialized language as a design tool adds yet another expense to the IC development process. Finally, "hardware aware" design tools which rely upon progressive elaboration design techniques require source code modifications to work properly.

Accordingly, a need exists in the electronics industry for capturing design functionality in a more abstract manner than is presently available with conventional hardware description languages.

SUMMARY OF THE INVENTION

The invention disclosed herein addresses the need in the electronics industry for capturing design functionality in an abstract manner. In particular, the present invention provides a solution for analyzing an algorithm captured in a general purpose high level software programming language and deriving a hardware description from that high level language design. The present invention utilizes a data abstraction model to create "objects" and provides methods and operations which can act upon those objects and object data fields. The data and control flow of the high level language design can be analyzed. Accordingly, given identical data input values, a synthesizable hardware description can be derived which implements the same functionality and produces the same data results as the original software specification. Notably, the present invention does not require edits to source code to function properly.

One aspect of the present invention can include a method of designing an integrated circuit using a general purpose programming language. According to one embodiment of the present invention, the programmatic design can be represented as a flow-graph wherein nodes of the flow-graph correspond to instructions of the programmatic design. The method can include identifying a number of instances of each class allocated in a programmatic design implemented using the general purpose programming language. For example, a collection of instance objects representing each instance created in the programmatic design can be created.

The global memory of the programmatic design can be modeled. For example, a map of the global memory can be created wherein the map contains field variables for each instance in the programmatic design. Target fields of the programmatic design can be identified. Additionally, a determination can be made as to whether a given access to the target fields is read access or write access, and also, whether an accessing instruction of the target fields is resolvable. The map of the global memory then can be regenerated.

A data flow between the modeled global memory and instructions of the programmatic design which access object fields can be determined. Accordingly, instances targeted by object reference instructions in the programmatic design can be identified. The modeling step also can include identifying read-only fields and fully determinate accesses to the read-only fields and replacing the memory access with the constant value in the read-only fields. The constant values can be represented by symbolic constants. Further, the read-only fields can be removed from the modeled global memory.

Additionally, the modeling step can include identifying memory write accesses to fields which have been determined to be write-only fields, removing write access to the write-only fields, and configuring data flows to account for the removed write accesses. The write-only fields can be removed from the modeled global memory.

The method further can include the step of scheduling access to the modeled global memory. The scheduling step can include identifying at least one memory object included within an instance which is determined when the programmatic design is compiled. The memory object, for example a field, a static field, or an array, can include a field that is accessed which also is determined when the programmatic design is compiled. The identified memory objects can be removed from the global memory. A new memory can be created for each of the memory objects removed from the global memory and references to the removed memory objects can be reconnected to the new memories. The scheduling step also can include determining whether a resource such as the global memory, an optimized memory, a static field register, a field, or an array of the programmatic design is accessed by more than one instruction per clock cycle.

The scheduling step also can include creating a memory structure according to the map of the global memory. Each location in the memory structure can be initialized with the initialization values specified in the map of the global memory. A hardware description of arbitration logic can be created, wherein the arbitration logic is configured to allow a single access to the memory per access port. A hardware description of address generation logic can be created, wherein the address generation logic is configured to transform a base address and an offset value into a single address for accessing the memory structure. Synthesizable data flows can be created between field read and write instructions of the programmatic design and the address generation logic as well as the arbitration logic.

The scheduling step also can include decomposing portions of the modeled global memory into parallel, independent registers to allow multiple accesses per cycle. The data flows of the decomposed memory can be replaced with direct connections from a data source to a data consumer if both the data source and the data consumer are fully determinate.

The programmatic design can be translated into a hardware description of the integrated circuit using the modeled global memory, the data flow, and the scheduled memory access. According to one aspect of the invention, the translating step can translate the map of the global memory into a hardware description that conforms to a hardware description language specification that can be synthesized into an integrated circuit.

BRIEF DESCRIPTION OF THE DRAWINGS

There are shown in the drawings embodiments which are presently preferred, it being understood, however, that the invention is not limited to the precise arrangements and instrumentalities shown.

DETAILED DESCRIPTION OF THE INVENTION

Figure 1:
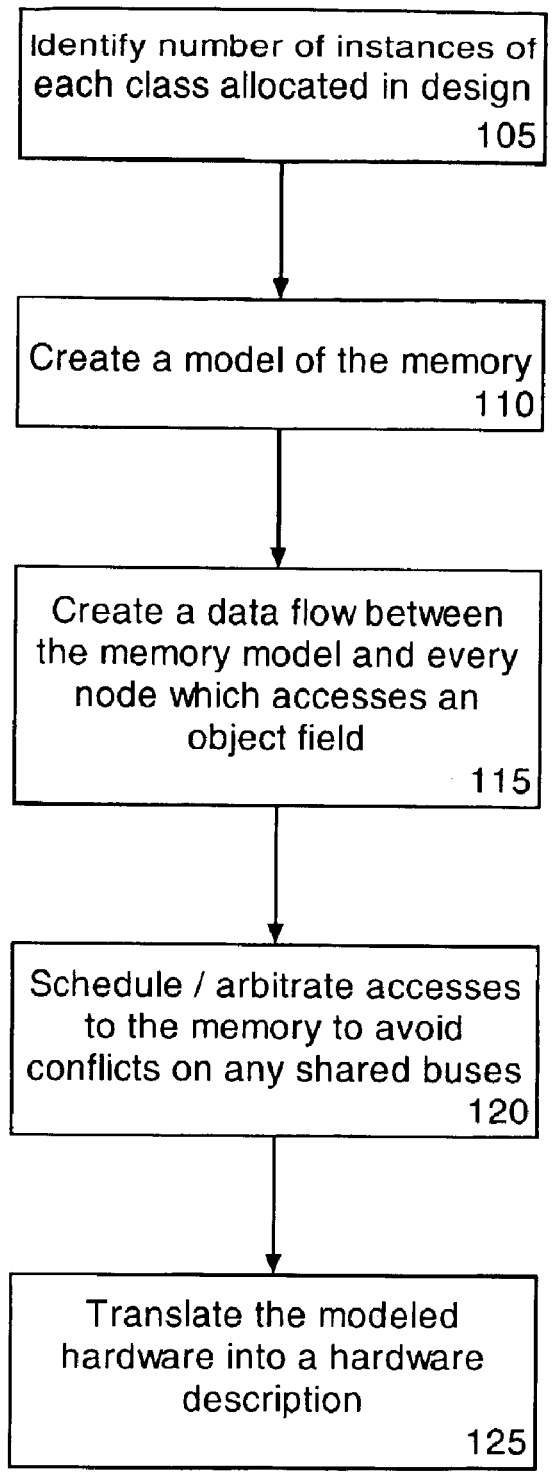
FIG. 1 is a flow chart illustrating a method of translating a high level language design implementation into a synthesizable hardware description in accordance with the inventive arrangements disclosed herein.

The invention disclosed herein provides an automated solution for deriving a hardware description from a general purpose high level language design implementation of an integrated circuit (IC). According to the present invention, an algorithm to be implemented by an IC, which has been implemented in a high level language, can be transformed automatically and directly into a hardware description.

Prior to generating a hardware description from the high level language design, the source code is transformed into a usable format such as a flow-graph constructed of nodes and directed edges. The flow-graph provides a language independent model designed to be neutral with respect to both software and hardware. From the flow-graph, an equivalent hardware description language specification can be derived. Through an analysis of the flow-graph, as will be described herein in greater detail, one or more of a variety of optimizations can be applied to improve the design of hardware resulting from the high level language design.

The flow-graph can be generated automatically in a number of different ways. One method of generating the flow-graph is to parse the source code to determine the flow-graph structure. Alternatively, the flow-graph can be generated by compiling the source code and identifying stack operations. In particular, instructions that generate data and instructions that consume data can be identified through an analysis of stack operations. Program branching serves to identify needed control structures.

The completed flow-graph can be made of a series of smaller flow-graphs, each of which corresponding to a method, a routine, a function, or other portion of the whole high level language design. Each node of the completed flow-graph represents an atomic instruction to be performed. Notably, each node can include 0 (zero) or more data inputs, 0 (zero) or more data outputs, an operation to be performed on the specified inputs to produce an output, or an operation to be performed on a structure outside of the flow-graph. Nodes also can include a "call" to another flow-graph which passes data to the called flow-graph and returns data (if any) to the current flow-graph. Each edge can represent a data or control flow through the flow-graph. An edge also can be referred to as a bus. The edge can have a single source and 1 (one) or more sinks. Edges can have a defined width indicating the precision of the data flow represented by the edge.

The high level language design, if implemented in an object-oriented language, includes one or more classes which can be instantiated. The high level language design can include methods for operating on those instantiations.

Data structures in each class can be replicated for each instance unless declared static, in which case the data structures can be shared among all instances of the class. High level language designs can incorporate one or more other entry methods. Each entry method indicates a starting point for logical processing of an algorithmic design and defines the top of a hierarchical tree of logic and/or calls to other methods. The entry method operates in parallel with the other methods.

FIG. 1 is a flow chart illustrating a method 100 of translating a high level language design into a synthesizable hardware description in accordance with the inventive arrangements disclosed herein. The method 100 presents an overview of the various processes to be described herein in greater detail with reference to FIGS. 2–8. The method 100 can begin after a flow-graph representation of the high level language design source code has been generated. Accordingly, in step 105, the number of instances (objects) of each class allocated in the design are identified. Objects that are handled during runtime, however, can be handled separately.

In step 110, a model of the memory of the high level language design can be created. In particular, data storage can be allocated for each field of each identified object. The allocated data storage, or memory, can be sufficiently large so as to properly accommodate the identified fields. Memory locations can be allocated to each object according to the fields which that object contains. Each object can be assigned a "base address". For primitive values, the memory can be initialized to the values specified in the high level language design. For fields which hold object references, the fields can be initialized with the base address of the referenced object.

A data flow can be created between the memory model and each node that accesses an object field in step 115. Data flows can be created for both read and write memory accesses. The data flows can specify object handles (base addresses), field identifiers (offsets), data written to memory for write actions, data read from memory for read actions, and any necessary control signals.

Referring to step 120, accesses to the memory can be scheduled and/or arbitrated to avoid conflicts on any shared memory buses such as address buses or data buses. For example, sequential elements such as flip-flop and registers can be included in the control and data flow to delay one or more memory accesses and maintain a data state before or after a memory access.

In step 125, the modeled hardware can be translated into a hardware description. The modeled hardware description can be translated into an output format which conforms to a known hardware description language such as VERILOG and/or VHDL. Still, the hardware description can be transformed into a netlist or programming data which can be downloaded directly to the IC under development for implementation of the algorithm of the high level language design.

Figure 2:
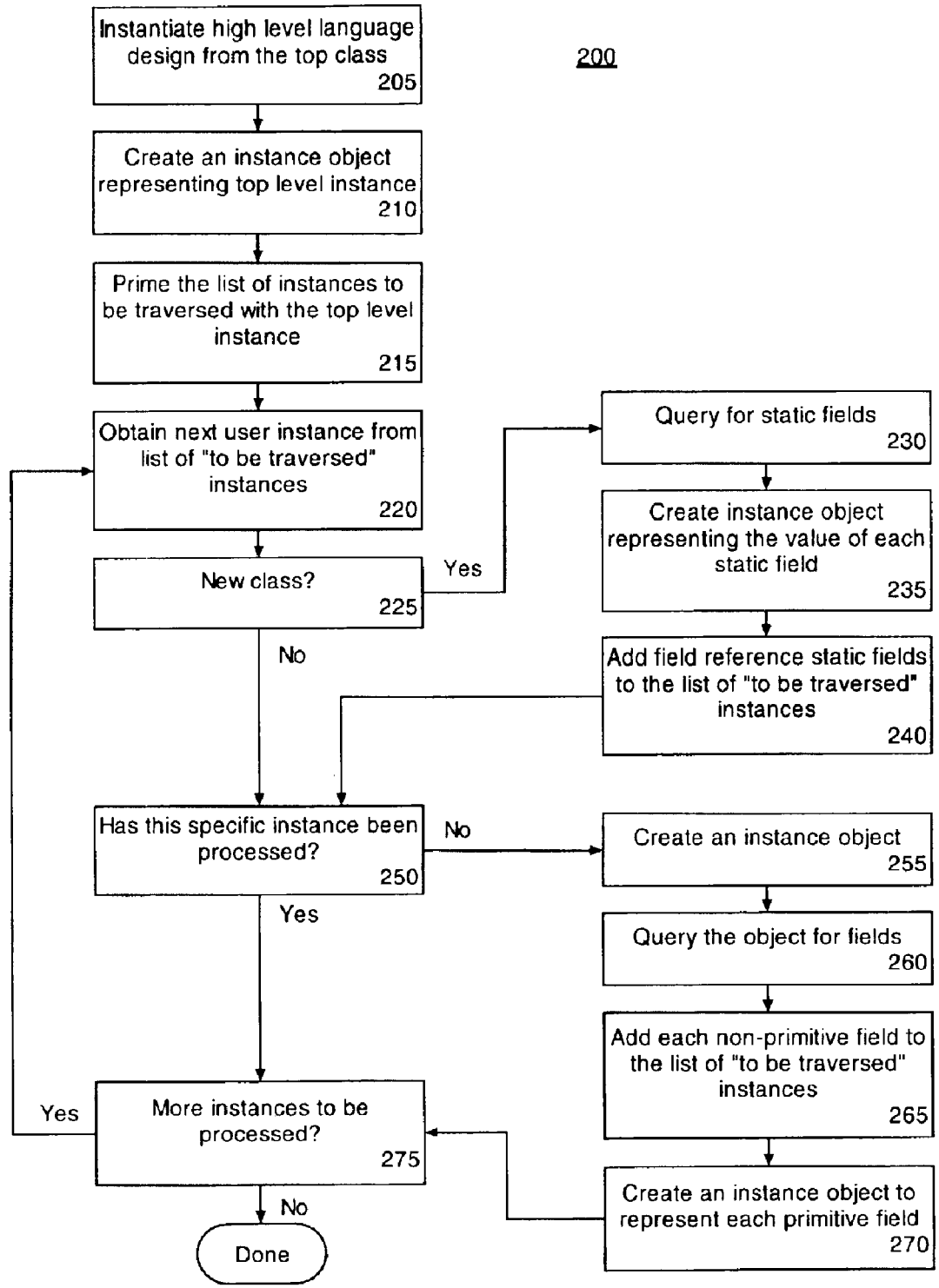
FIG. 2 is a flow chart illustrating a method for identifying instances of each class allocated in a high level language design implementation.

FIG. 2 is a flow chart illustrating a method 200 for identifying instances of each class allocated in a high level language design. The method 200 presents a more detailed description of actions which can be taken in fulfillment of step 105 of FIG. 1. A representation of all instances in the design and the initial values of those instances can be determined to build a static picture of the memory resources required for the design. The method 200 can begin in step 205 where a high level language design can be instantiated from the top class. In instantiating the design, the code included in the constructor of any instantiated class is executed. This enables a user to perform complex calculations, file input and output, accesses over a network, or any other functionality to generate the initial values of a field, array, static field, and the like, of the design.

In step 210, an instance object can be created which represents the top level instance that was instantiated. In step 215, the list of instances to be traversed is primed with the top level instance. Traversing a flow-graph means analyzing each node in the flow-graph and any flow-graphs called by nodes in the flow-graph being traversed. In step 220, an instance is obtained from the list of "to be traversed" instances. A determination can be made in step 225 as to whether the obtained instance is a new class. If so, the method can proceed to step 230 where the instance can be queried for static fields belonging to the object. For example, the instance can be queried using reflection techniques or via source code analysis. In step 235, an instance object representing the value of each static field can be created. In step 240, the object instance to which the field points can be added to the "to be traversed" instance list.

Continuing with step 250, a determination can be made as to whether the specific instance, or instance under examination, has been processed. If not, the method can proceed to step 255, where an instance object can be created that represents the current instance. Using reflection, in step 260, the newly created object can be queried for fields. Each field which is a non-primitive field can be added to the "to be traversed" instance list in step 265. In step 270, an instance object can be created to represent each primitive field. The method can continue to step 275, where a determination is made as to whether more instances are to be processed. If so, the method can continue to step 220 to repeat until no further instances remain to be processed. If, in step 275, no further instances remain to be processed, the method can end.

It should be appreciated that while steps 230–240 pertain to processing static fields, steps 255–270 relate to processing non-static fields. Accordingly, steps 230–240 are executed only a single time for each type of class when the first instance of that type is encountered. Steps 255–270, however, are executed for each specific instance of each type of class. Further, those skilled in the art will recognize that although the inventive arrangements described herein can include particular details and/or examples which may be applicable to one or more particular programming languages, the present invention can be used to process any of a variety of high level programming language designs.

Figure 3:
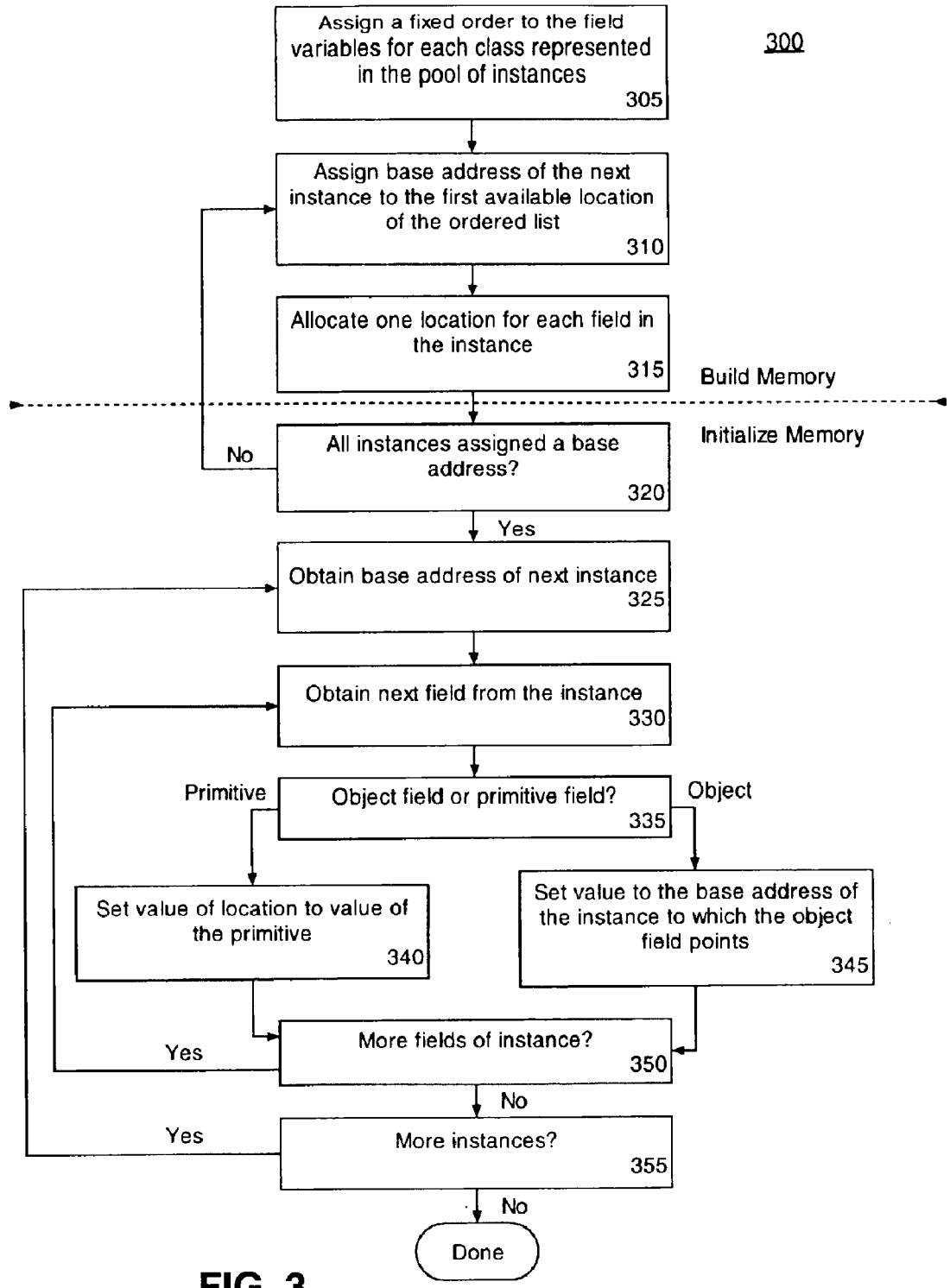
FIG. 3 is a flow chart illustrating a method of creating a model of the memory of the high level language design implementation.
Figure 4:
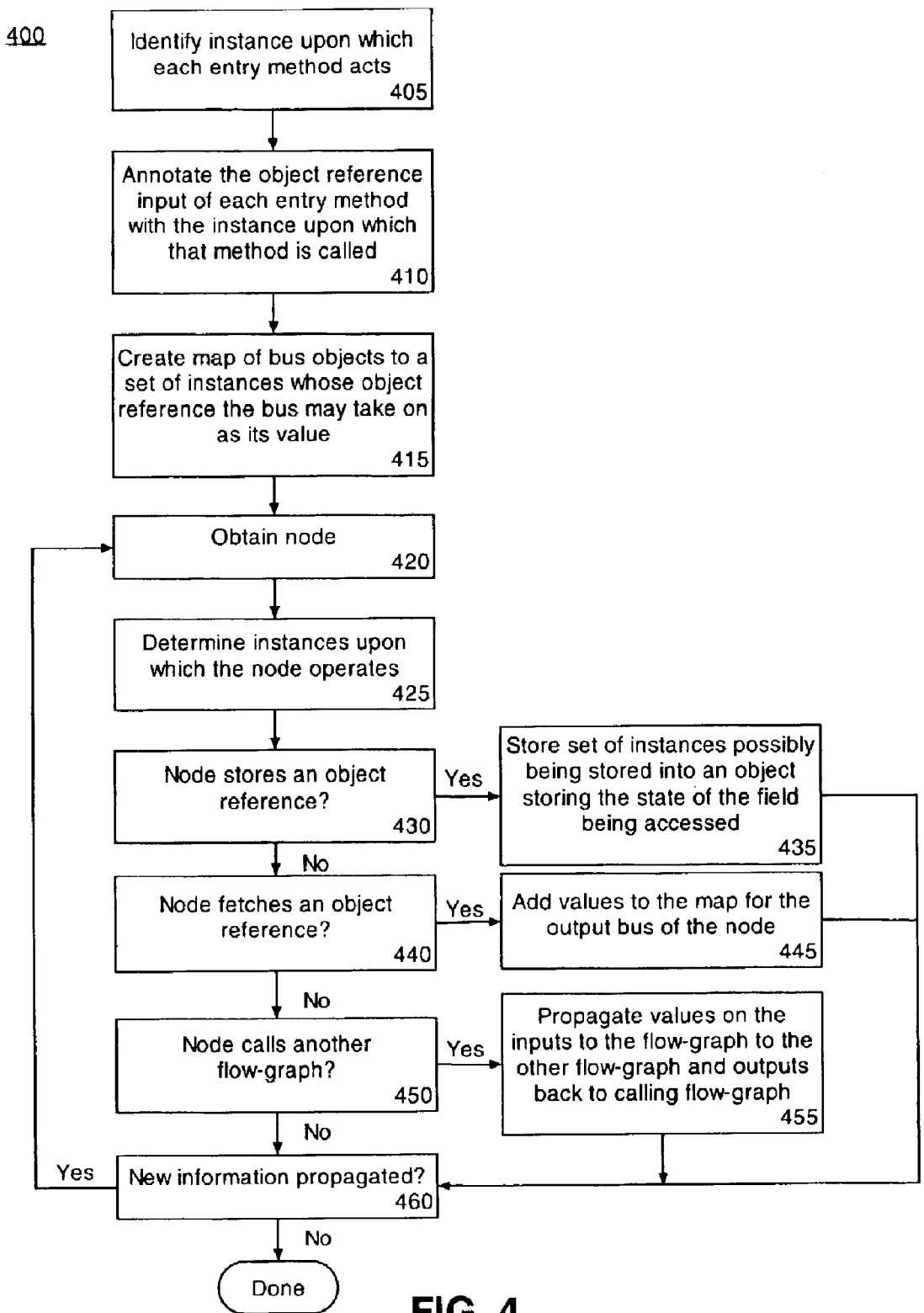
FIG. 4 is a flow chart illustrating a method of determining which instances can be targeted by object reference instructions in the high level language design implementation.

FIGS. 3 and 4, taken together, provide a more detailed description of actions which can be performed when creating a model of the high level language design memory illustrated in step 110 of FIG. 1. By following several guidelines, the generation of a suitable model of the high level language memory can be ensured. In particular, the memory can be modeled as an ordered list of values. Each location in the ordered list can represent one field of one instance, a static field for each class, or one element of an array. All fields of a given instance can be located in sequential elements of the ordered list. Each instance can have a base address, which is the address of the first field in the ordered list. Each field can have an offset which is the position of the field relative to the base address of the instance to which the field belongs. The offset of any given field of a class is the same for that field in any instance.

FIG. 3 is a flow chart illustrating a method 300 of creating a model of the memory of the high level language design. The method 300 can be performed, at least in part, in fulfillment of step 110 of FIG. 1. Beginning in step 305 a fixed order can be assigned to the field variables for each class represented in the pool of instances. In step 310, the base address of the next instance can be assigned to the first available location of the ordered list. The locations of the ordered list can begin with the number 0 (zero). Referring to step 315, one location can be allocated for each field in the instance. In step 320, a determination can be made as to whether all instances have been assigned a base address. If not, the method can loop back to step 310 and repeat until each instance has been assigned a base address.

The memory model reflects the initialized memory of the high level language design prior to execution, but after execution of the constructors. The memory model, however, need not have the exact ordering as, for example a Java Virtual Machine would. Rather, the memory model has the same number of locations and each object reference points to the same object instance.

After constructing the memory model, the memory model can be initialized such that each location has an initial value. For primitive fields, the value can be set to the value of the primitive. For object fields, the value can be set to the base address of the instance pointed to at reset, that is at the start of execution of the high level language design. Accordingly, in step 325, the base address of the current instance can be obtained. In step 330, the next field from the instance can be obtained. In step 335 a determination can be made as to whether the field is a primitive field or an object field.

If the field is a primitive field, the method can proceed to step 340, where the value of the location can be set to the value of the primitive. If, however, the field is an object field, the value of the location can be set to the value of the base address of the instance to which the object field is pointing. Continuing to step 350, if additional fields of the instance are to be processed, the method can loop back to step 330 to repeat as necessary until all fields of the current instance have been processed. If all of the fields of the current instance have been processed, the method can continue to step 355, where a determination can be made as to whether additional instances are left to be processed. If so, the method can loop back to step 325 to obtain the next base address of the next instance and repeat as necessary to continue processing fields of that instance and further instances. If no further instances are left to be processed, the method can end.

FIG. 4 is a flow chart illustrating a method 400 of determining which instances can be targeted by object reference instructions in the high level language design. The method 400 elaborates upon actions which can be taken in fulfillment of step 110 of FIG. 1. Accordingly, in step 405, the instance upon which each entry method acts can be identified. In step 410, the object reference input of each entry method, for example the "ARG0" directive, can be annotated with the instance upon which the method is called. In step 415, a map of bus objects to set of instances can be created. In particular, the set of instances mapped to bus objects can be instances having object references which the bus objects may take on as values. As used herein, a map can include a data structure in which objects are retrieved based on a key, for example a Java-based hash map. A set can refer to a collection of objects guaranteed to contain one and only one instance of each object in the collection.

The nodes of the flow-graph can be recursively processed beginning in step 420 where a node can be obtained. In step 425, instances upon which the node operates can be determined. For example, the bus connected to the object reference input of the instruction in the memory map can be determined. The set of possible instances that the bus may take as a value can be retrieved. If the map does not contain the bus as a key, then the bus currently holds no known instance as a value.

In step 430, a determination can be made as to whether the present node stores an object reference. If so, the method can proceed to step 435 where the set of instances possibly being stored into a field can be stored. The set of instances can be stored in an object designated to store the state of the field being accessed. For example, the set of instances can be identified by looking up the "data" input bus of the instruction in the memory map. This operation can be repeated for every possible instance being targeted by the present instruction based upon the object reference input of the instruction node.

If the node does not store an object reference, the method can proceed to step 440 where a determination can be made as to whether the node fetches an object reference. If so, the method can proceed to step 445, where values fetched by the instruction can be added to the map for the output bus of the node. For example, values retrieved responsive to instructions which read a field or a static field, or load a value from an array can be added to the map. The set of instances to add to the set in the map for the output bus can be determined by querying the instruction to identify the set of all instances that potentially can be referenced by the memory location accessed by the instruction. This information can be determined from the object that tracks the state of the field being accessed.

If the node does not fetch an object reference, the method can proceed to step 450. In step 450, a determination can be made as to whether the node calls another flow-graph. If so, the method can proceed to step 455, where values on the inputs to the flow-graph can be propagated to the other flow-graph and outputs from the called flow-graph can be propagated back to the calling flow-graph. In step 460, a determination can be made as to whether any new information has been propagated during the most recent pass (steps 420–455). If so the method can loop back to step 420 and repeat until no new information has been propagated. That is, the method can repeat until each instruction has the complete set of instances identified as targets.

Figure 5:
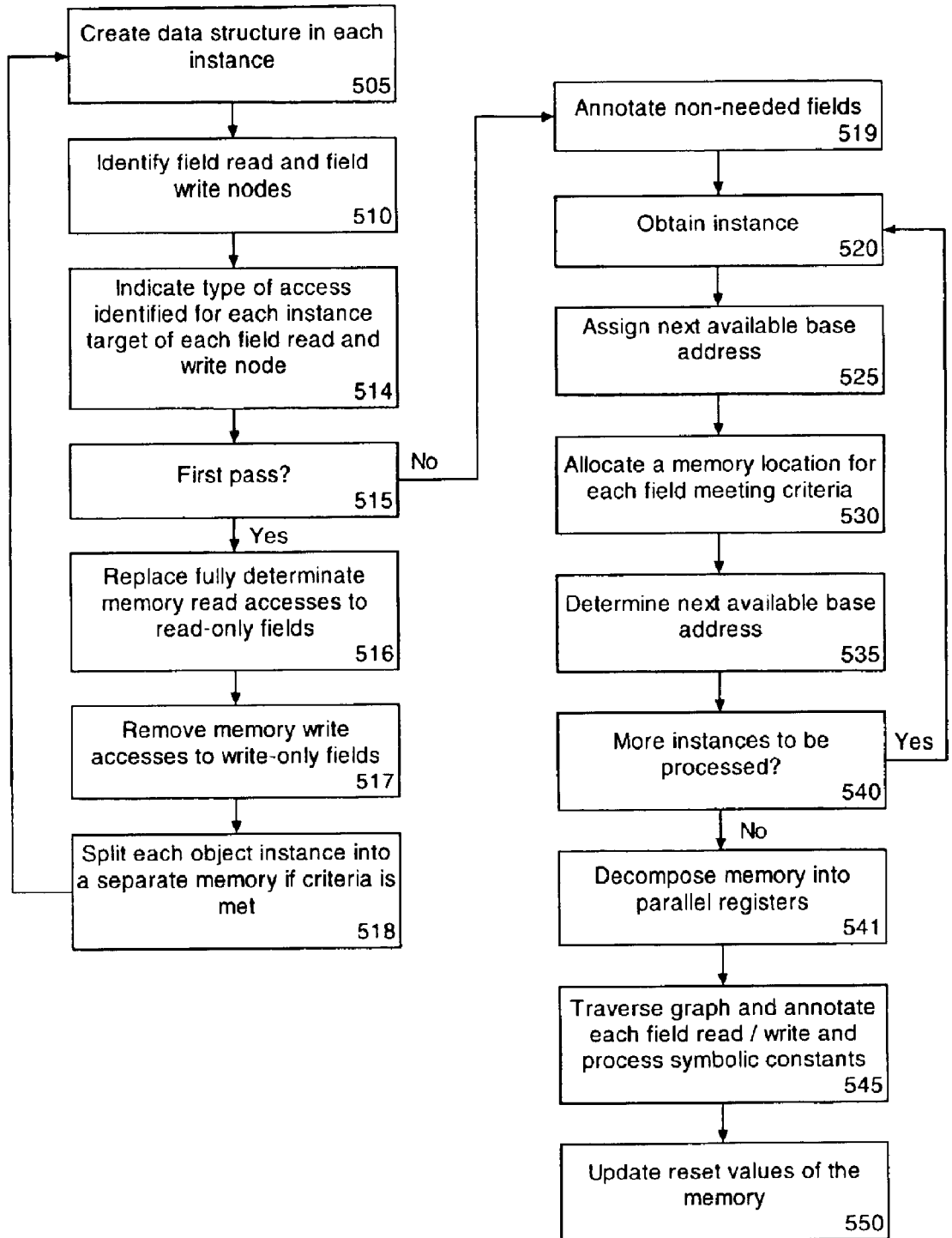
FIG. 5 is a flow chart illustrating a method for optimizing the created memory model derived in FIGS. 3 and 4.

FIG. 5 is a flow chart illustrating a method 500 for optimizing the memory model created in FIGS. 3 and 4. A data structure capable of tracking the status of each field in an instance can be created for each instance. In particular, the data structure can track when a field is read or written and when a field is one possible target of a read or write that cannot fully be resolved at compile time. The method 500 can begin in step 505 where a data structure can be created in each instance. In step 510, the flow-graph can be traversed to identify each node that initiates a read or a write to a field. Notably, step 510 can be performed during construction of the flow-graph for increased efficiency and time savings. In step 514, the type of access identified can be indicated for each possible instance target of each field read and field write node or instruction. If a field read or a field write has multiple possible target instances, then an indication can be made in each possible target that the field is read or written, but that the access cannot be fully resolved.

Once the traversal of the flow-graph is complete and each field has been annotated with information identifying whether the node is read, written, or is the target of an indeterminate access, several optimizations can be applied. Accordingly, in step 515, if steps 505, 510, and 514 have been performed one time, that is within a first pass, the method can proceed to step 516. In step 516, any memory read accesses which are fully determinate and which access a field which is read-only can be replaced with a constant value equal to the initial value of that field. Notably, the value of such fields will not change during runtime. If the field is a reference to an object instance, then the constant value inserted into the flow-graph is equal to the base address of that instance in memory. Since the memory map is still evolving due to the optimizations being performed, the inserted constant can be symbolic until the final memory map is achieved. At that point, the symbolic constant is replaced with a numeric constant equal to the base address of the instance to which the symbolic constant points.

In step 517, any memory write accesses to a field which has been determined to be a write-only field can be removed. These data values will never be used, and thus, memory write access is not needed. In step 518, each object instance which meets the criteria for being factored out can be split into its own memory. For example, an instance such as an object instance, an array, or the like, may be factored out into its own memory if all memory accesses that can possibly target that instance have been resolved to target only that instance. Since the number of memory access has been modified by the optimizations of steps 516, 517, and 518, steps 505, 510 and 514 can be performed again to form an accurate representation of the usage of each field in each memory. Accordingly, the method can proceed to step 505 and continue operation to step 515, where the method can branch to step 519.

In step 519, particular fields of each memory can be marked as non-needed fields in that memory if particular criteria are met. Non-needed fields are fields which meet the following criteria: (1) in all instances of the field's class in the memory, that field is not accessed and the field is not part of an array, or (2) the field is part of an array, is not accessed, and is the last field in the array. Notably, once the last field of an array is removed, the next to the last field of the array may meet this criteria. Accordingly, the array can be iteratively examined and shortened, but no field may be removed from the middle of the array.

Once the traversal of the flow-graph is complete and the memory access characteristics are specified, the memory can be reconstructed and the memory map can be regenerated. In reference to steps 520–540, each memory can be condensed to eliminate non-needed fields. Once the non-needed fields have been removed from each memory the memory map can be re-generated. The memory is processed to generate new base addresses for each instance contained in that memory. Starting at location 0, each instance is given a new base address where the next available base address is the previous base address+the number of remaining fields in the instance to which the previous address was allocated.

Accordingly, in step 520, a first (or next) instance can be obtained. In step 525, starting with 0 (zero), the next available base address can be assigned to the instance. In step 530, a memory location for each field that meets the criteria can be allocated. In particular, a memory location can be allocated for each field that is both read and written, is the target of an unresolved access, or if the field meets the criteria for any instance of the present class.

In step 535, the next available base address can be determined. The next available base address can be determined as (the current base address)+(the number of fields meeting the specified criteria in the current instance). In step 540 a determination can be made as to whether any additional instances remain to be processed. If so, the method can loop back to step 520 to repeat until no further instances remain to be processed. If no instances remain to be processed, the method can proceed to step 541 where the flow-graph can be further optimized.

In step 541, any memory which was factored out of the global memory can be decomposed into parallel registers. Each of these memories has already been determined to contain instances to which all accesses are fixed at compile time. To be eligible for factoring out of the memory and into parallel registers, all accesses to the object instance must be queried for a field/array index offset. If all accesses to a given object instance contained in a memory which has been factored out of the global memory (because all accesses to the object instance had fixed object references) contain constant field/array index offsets, then the object instance can be decomposed.

Decomposition takes place by creating one enabled register for each field/location in the instance. Each access in the flow-graph that targeted the decomposed object instance in memory is re-targeted to the specific register indicated by the constant value on the offset input to the memory access. Read accesses receive their data value from the register output. Write accesses supply data and a write enable to the register input. When decomposed, the object instance is removed from the memory. If all instances and fields have been removed from a memory in the design, that memory is removed from the implementation.

In step 545, the flow-graph can be traversed again to annotate each field read and/or write node with the new field offset values generated during the memory optimization. Each symbolic constant included in the flow-graph during step 516 can be converted to a numeric constant corresponding to the base address or offset which the symbolic constant was to represent. In step 550, the reset values of the memory can be updated.

Figure 6:
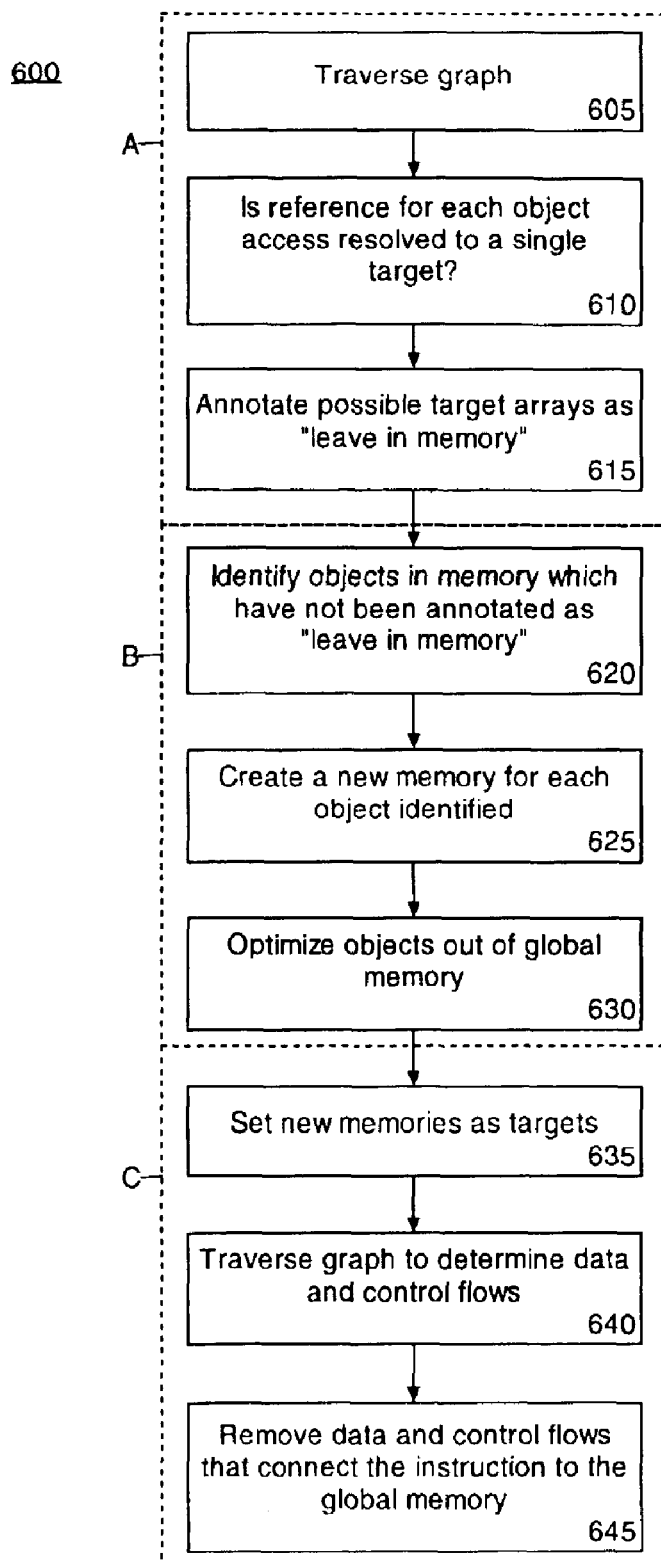
FIG. 6 is a flow chart illustrating a method of optimizing the hardware description of the high level language design implementation.
Figure 7:
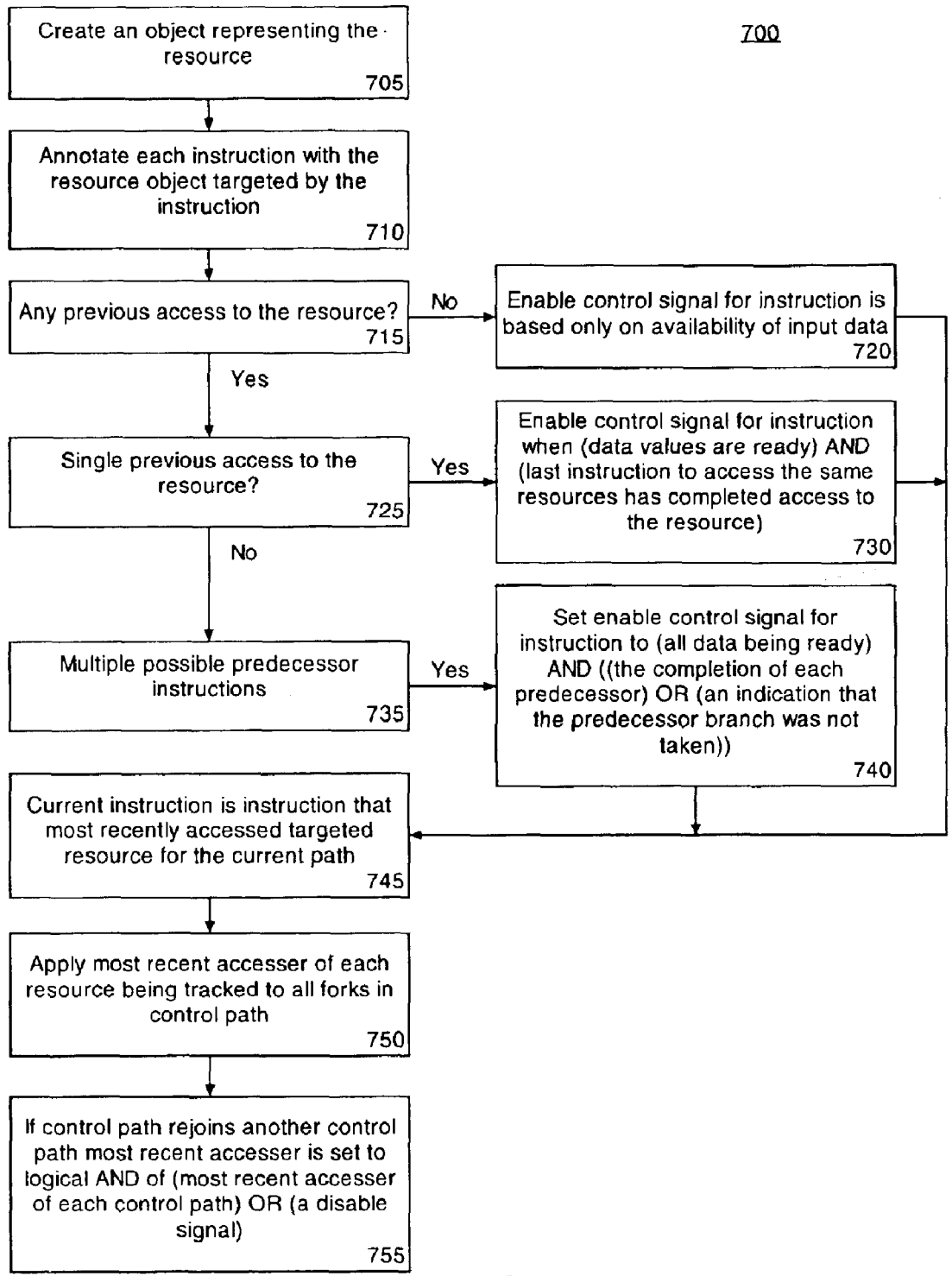
FIG. 7 is a flow chart illustrating a method of scheduling memory access for the hardware description according to the high level language design implementation.

FIGS. 6 and 7, taken together, illustrate a method of scheduling access to the memory model to avoid conflicts in accordance with step 120 of FIG. 1. Accordingly, FIG. 6 is a flow chart illustrating a method 600 of optimizing the overall data throughput and hardware speed of a hardware description as determined from the high level language design. The area required for the hardware implementation of the high level language design also can be reduced. FIG. 6 provides further detail with regard to step 519 of FIG. 5.

Accordingly, the method 600 illustrates a method of splitting arrays and/or object instances into separate memories and can be segmented into three sections. In section A, in step 605, the graph can be traversed. Accordingly, in step 610, a determination can be made as to whether the reference for each object access is resolved to a single target. The determination can be made by obtaining the set of object references for the object reference input to the object access from the memory map referred to in FIG. 4. If the access is not resolved to a single target, for example the object access node has two or more possible targets, the method can proceed to step 615, where possible target object instances are annotated as "leave in memory".

Proceeding to section B, in step 620, any objects in memory which have not been annotated as "leave in memory" can be identified or flagged for optimization out of the global memory. In step 625, a new memory can be created for each object identified in step 620. In particular, the size of each newly created memory can be equated to the size of the array/object instance being optimized for which the new memory has been created. Accordingly, in step 630, each object identified or flagged in step 620 can be optimized or removed from the global memory and entered into the newly created memory corresponding to the identified object. That is, the object can be factored out into a separate memory.

In section C, the graph can be traversed again. In particular, in step 635, the newly created memories can be set as targets. For each newly created memory, that memory can be set as a target for every object access that has this object set as a target. In step 640, any data and control flows which connected the instruction to the global memory can be determined. Accordingly, in step 645, any identified data and control flows that connected the instruction or node to the global memory can be removed as the node now references a different memory. Once the control flows and data flows have been removed from the old memory, the flows must be reconnected to the new memory.

Notably, to be a candidate for optimization out of the global memory, a field, a static field, or an object must meet particular criteria. For an object to be factored out of memory, only the base address must be a constant value for all accesses which may target that object. There can be no accesses in the flow-graph which target both that object and another object as determined by runtime conditions. If this criteria is met, a new memory can be instantiated separately from the global memory. All references to that object may be reconnected to that newly created memory. Note that a memory may be either a random access memory (RAM), a read-only memory (ROM), a flip-flop, a register, a latch, or another hardware structure capable of storing a data value across multiple clock cycles.

Accordingly, all objects in a memory to which all accesses are determinate can be identified. Access are determinate if there exists no accesses in the flow-graph which target the object and potentially another instance of the same class (or another array). For example, any base address input of any access in the flow-graph that can target the object in question has, as a set of possible values, only a single value which points to the object in question. For any object which is fully resolved, or all classes are determinate, a new memory with sufficient storage capacity to contain all fields of that object, or elements in the case of arrays, can be created. Initial values of fields or elements can be primitive values or point to base addresses in global memory. All accesses of that object in the flow-graph to the newly created memory can be retargeted.

FIG. 7 is a flow chart illustrating a method 700 of scheduling memory access in accordance with the inventive arrangements disclosed herein. The method 700 can ensure that no resource, whether the global memory, an optimized memory, a static field register, or the like, is accessed by more than one instruction per clock cycle. Accordingly, the method can begin in step 705, where an object representing the resource can be created. In step 710, each instruction can be annotated with the resource object targeted by that instruction.

A control flow signal can be created such that each instruction is enabled when the data values referenced by that instruction are ready and the last, or most recent predecessor, instruction to access the same resource has completed access of the resource. Completed access of the resource can be indicated by a "done" control signal. Thus, in step 715, a determination can be made as to whether there has been any previous access to the resource. If not, the method can proceed to step 720 where the enable control signal for the instruction is based only on the availability of input data. If there has been previous access to instruction, the method can proceed to step 725.

In step 725, a determination can be made as to whether there has been a single previous access to the resource. If so, the method can proceed to step 730, where the enable control signal for the instruction can be set when data values are ready and the last instruction to access the same resource has completed access to the resource. If more than one predecessor instruction accesses the resource, then the method can proceed from step 725 to step 735, and on to step 740. For example, such can be the case where control flow branches rejoin the primary control flow graph. Accordingly, in step 740, the enable control signal for the instruction can be set for (all data being ready) logically "AND'ed" with ((the completion of each predecessor) logically "OR'ed" with (an indication that the predecessor branch was not taken)).

The method can proceed to step 745, where the current instruction is now the most recent accesser of the targeted resource for the current control path. In step 750, if a control path forks, the most recent accesser of each resource being tracked can be applied to all forks in the control path. In step 755, if a control path rejoins another control path, the most recent accesser can be set to the logical "AND" of the (most recent accesser of each control path) logically "OR'ed" with (a disable signal), for example one that indicates that the path was not taken.

According to another aspect of the present invention, the necessity of adding dual ports, multi-ports, up to "n" ports to a memory can inferred from the flow graph. In particular, based upon the flow-graph, memory access nodes can be determined. If multiple accesses, i.e. reads or writes, occur simultaneously, multiple ports can be allocated to an array. Inferring required ports can increase design performance significantly. For example, extra ports can be inserted for multiple readers within the same thread of control. Extra ports also can be inserted for accesses by different threads of control or different entry methods. Accesses then can be allocated to ports based upon the number of accesses per clock cycle.

The need for memory arbitration logic can be inferred in the case where a sufficient number of ports cannot be added to accommodate the number of accesses which can occur during the same clock cycle. Scheduling can ensure that multiple accesses do not occur within the one thread of control. In situations where multiple threads of control are running independently of one another, and multiple threads of control can access the same memory and/or memory port in the same clock cycle, however, an arbitration circuit is inserted. The arbitration circuit ensures that every access will complete. Accesses also can be delayed until a prior access completes. Arbitration can be round robin or priority based depending on code requirements.

Memory further can be optimized by replicating Read Only Memories (ROMs). More particularly, for any object or array which is entirely a ROM, data throughput can be improved by replicating the ROM for each access. For example, the flow-graph can be traversed to identify accesses to the ROM. For each determinate access, a new ROM whose contents are identical to the original ROM can be created. Accesses to the ROM can be retargeted. Alternatively, a new port on an existing copy of the ROM, if a copy exists which has only 1 port, can be created. This technique incorporates dual port ROMs to reduce resources while still improving throughput.

Figure 8:
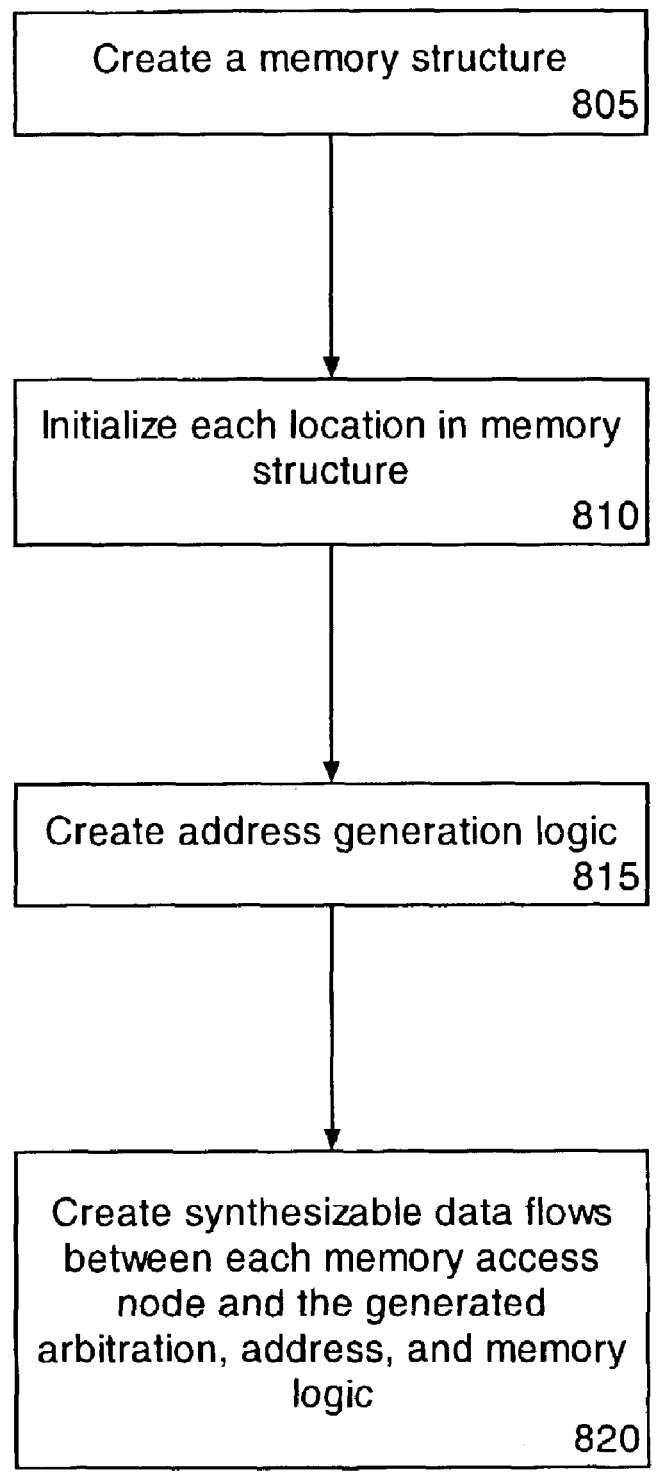
FIG. 8 is a flow chart illustrating a method of generating a synthesizable hardware description of the memory of the high level language design implementation.

FIG. 8 is a flow chart illustrating a method 800 of generating a synthesizable hardware description from the hardware model in accordance with step 125 of FIG. 1. The method 800 can begin in step 805 where a memory structure such as a RAM or a ROM can be created. For example, a ROM memory structure can be created if all memory locations are read-only locations. If some memory locations are to be written, then a RAM memory can be created.

In step 810, each memory location within the created memory structure can be initialized. In particular, the memory can be initialized to the values of corresponding locations of the memory map. For example, the memory can be initialized with data values for primitive locations and base addresses for object handle locations. In step 815, address generation logic can be created. The address generation logic can transform a base address and an offset value into a single address for accessing the memory. This operation can be an addition, a logical "OR", or another structure based upon how the memory is to be organized. In step 820, the synthesizable data flows can be created between each memory access node, for example field read or write nodes, and the generated arbitration and address memory logic. The data flows can include, but are not limited to, wires, registers, ports on modules, and the like.

Memories must be instantiated at the hierarchical level at which the highest level access exists. That is, if 2 (two) called methods, subroutines, and/or sub-graphs in the flow-graph access a given memory, then the memory must be instantiated at or above the hierarchical level at which both of the calls (or trees) are rooted. The physical connections to the memory then can be percolated up through the module hierarchy to connect to the instantiated memory. Notably, the instantiated memory can be implemented in an off chip memory. Accordingly, all memory accesses can be routed to an off chip memory interface instead of an instantiated memory. Scheduling must know what characteristics the off chip memory has in terms of access times and the like to correctly schedule the design. This information can be provided by the user or can be known as a "standard" interface. The decision to use an off chip memory can be made by determining that insufficient memory resources are available in the target chip technology (as specified by a designer).

Multiple accesses at any single level of the hardware description language hierarchy can be merged into a single access that is presented to the next level up in the hierarchy. This can be handled by a complex multiplexer that performs several functions simultaneously. A de-multiplexer can be incorporated to correctly distribute "done" or "access complete" signals to the correct accesser.

The various techniques disclosed herein can be optimized for improved performance. According to one embodiment of the present invention, rather than allocating all accessed fields to all instances of that class, the instances can be divided into smaller groupings. Each group can include instances which are accessed by the same set of instructions. Thus, fewer fields need be allocated based upon the set that is accessed by the reduced set of instructions. This technique can be applied in cases where the instances in the reduced set are accessed only by the reduced set of instructions.

According to another aspect of the present invention, instances of each class can be broken into separate memories. This technique can reduce the chaining of calls to the memories, as well as aid mapping and place and routing due to the workings of distributed memories. Another technique can be to allocate all arrays into memory so that the arrays can be dynamically accessed.

Another optimization technique can include organizing memory accesses into local data flows. Any sequence of instructions, even in the case where the sequence spans a method boundary, which consecutively stores then loads a data value to or from an object field, whether static or not, can be candidates for in-lining. In-lining refers to the case where the field access is removed and the data value is directly wired from data producer to the data consumer. Certain criteria, however, are required. In particular, the field to be resolved into a local data flow must be accessed by only one thread of control unless the multiple threads contain synchronization such that the order of accesses across all accessing threads of control can be guaranteed to be consistent and predictable. Additionally, if the data is produced in a cycle that is different from the cycle in which the data will be consumed, a data storage element, for example a latch or a register, must be created to store the produced data until the data is consumed.

Object lifetime analysis, which entails resolving writes, reads, and discard references to data flows also can be performed. Objects having a limited lifecycle, measured from construction to the last reference, can be reduced to basic data flows. Accordingly, object fields can be replaced by wires connecting a data producer to one or more data consumers without allocated a memory.

The user also can be allowed to dynamically create and destroy objects. This can involve allocating a "heap" area in the object memory that is capable of being allocated to a new object when created and re-allocated after the object has been destroyed. Allocating space to a newly created object entails finding a block of available memory that is sufficient for storing all of the fields of the object. The base address of the block can be returned to the creator of the object as the object handle. The object handle can be used for any accesses to the object memory that are associated with the newly created object.

Once the design has been optimized, some object references still may be indeterminate. That is, the selection of a particular object upon which a field access is to act (i.e. what base address is to be used in the access) still may be one of several that will be selected based upon user data input to the design. In that case, the object handles simply can be data values that are passed through the graph and handled as data. The data can be passed through a multiplexer that will select the correct value based upon the selected input, which is based upon user data. Accordingly, the present invention can account for dynamic use of objects by a user.

Those skilled in the art will recognize that the present invention can be used to process any of a variety of high level programming language designs. Accordingly, although the inventive arrangements described herein can include particular details and/or examples which may be applicable to one or more particular programming languages, the present invention should not be construed to be limited for use with any one particular high level programming language. Rather, the inventive arrangements described herein can be applied to other programming constructs and/or structures found in any of a variety of high level programming languages which are representative of those described herein.

The present invention can be realized in hardware, software, or a combination of hardware and software. The present invention can be realized in a centralized fashion in one computer system, or in a distributed fashion where different elements are spread across several interconnected computer systems. Any kind of computer system or other apparatus adapted for carrying out the methods described herein is suited. A typical combination of hardware and software can be a general purpose computer system with a computer program that, when being loaded and executed, controls the computer system such that it carries out the methods described herein.

The present invention also can be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

This invention can be embodied in other forms without departing from the spirit or essential attributes thereof. Accordingly, reference should be made to the following claims, rather than to the foregoing specification, as indicating the scope of the invention.

What is claimed is:

1. A method of designing an integrated circuit using a general purpose programming language comprising:

identifying a number of instances of each class allocated in a programmatic design implemented using the general purpose programming language;

modeling a global memory of the programmatic design;

determining a data flow between the modeled global memory and instructions of the programmatic design which access object fields;

scheduling access to the modeled global memory, including identifying at least one memory object, representing an instance, which is determined when the programmatic design is compiled, removing the identified memory objects from the global memory, creating a new memory for each of the memory objects removed from the global memory, and reconnecting references to the removed memory objects to the new memories; and translating the programmatic design into a hardware description of the integrated circuit using the modeled global memory, the data flow, and the scheduled memory access.

2. The method of claim 1, further comprising:

representing the programmatic design as a flow-graph wherein nodes of the flow-graph correspond to instructions of the programmatic design.

3. The method of claim 1, said identifying step further comprising:

creating a collection of instance objects representing each instance created in the programmatic design.

4. The method of claim 1, wherein said modeling step creates a map of the global memory, said map containing field variables for each instance in the programmatic design.

5. The method of claim 4, wherein said translating step translates the map of the global memory into the hardware description, wherein the hardware description conforms to a synthesizable hardware description language specification.

6. The method of claim 4, said scheduling step comprising:

creating a memory structure according to the map of the global memory.

7. The method of claim 6, said scheduling step comprising:

initializing each location in the memory structure with initialization values specified in the map of the global memory.

8. The method of claim 7, said scheduling step comprising:

creating a hardware description of arbitration logic, wherein the arbitration logic is configured to allow a single access to the memory per access port.

9. The method of claim 7, said scheduling step comprising:

creating a hardware description of address generation logic, wherein the address generation logic is configured to transform a base address and an offset value into a single address for accessing the memory structure.

10. The method of claim 7, said scheduling step comprising:

creating synthesizable data flows between field read and write instructions of the programmatic design and the address generation logic.

11. The method of claim 10, said scheduling step comprising:

creating synthesizable data flows between field read and write instructions of the programmatic design and the arbitration logic.

12. The method of claim 4, said modeling step further comprising:

identifying target fields of the programmatic design; and determining whether access to the target fields is read or write access, and whether an accessing instruction of the target fields is resolvable.

13. The method of claim 12, said modeling step further comprising:

regenerating the map of the global memory.

14. The method of claim 1, said determining step further comprising:

identifying which instances are targeted by object reference instructions in the programmatic design.

15. The method of claim 1, wherein said memory objects are selected from the group consisting of fields, static fields, and arrays.

16. The method of claim 1, said scheduling step further comprising:

determining whether a resource of the programmatic design is accessed by more than one instruction per clock cycle.

17. The method of claim 16, wherein each said resource is selected from the group consisting of the global memory, an optimized memory, a static field register, a field, and an array.

18. The method of claim 1, said modeling step further comprising:

identifying as a first type read-only field each read-only field having a constant value and fully determinate accesses to the read-only field; and replacing each memory access to a first type read-only field with the constant value in the first type read-only field.

19. The method of claim 18, further comprising:

representing the constant values with symbolic constants.

20. The method of claim 18, further comprising:

removing the read-only fields from the modeled global memory.

21. The method of claim 1, said modeling step further comprising:

identifying memory write accesses to fields which have been determined to be write-only fields;

removing write access to the write-only fields; and configuring data flows to account for the removed write accesses.

22. The method of claim 21, further comprising:
removing the write-only fields from the modeled global memory.

23. The method of claim 1, said scheduling step further comprising:
decomposing portions of the modeled global memory into parallel, independent registers to allow multiple accesses per cycle.

24. The method of claim 23, said scheduling step further comprising:
replacing the data flows of the decomposed memory with direct connections from a data source to a data consumer if both the data source and the data consumer are fully determinate.

25. A machine-readable storage, having stored thereon a computer program having a plurality of code sections executable by a machine for causing the machine to perform the steps of:
identifying a number of instances of each class allocated in a programmatic design implemented using a general purpose programming language;
modeling a global memory of the programmatic design;
determining a data flow between the modeled global memory and instructions of the programmatic design which access object fields;
scheduling access to the modeled global memory, including identifying at least one memory object included within an instance which is determined when the programmatic design is compiled, wherein the at least one memory object includes a field that is accessed which also is determined when the programmatic design is compiled, removing the identified memory objects from the global memory, creating a new memory for each of the memory objects removed from the global memory, and reconnecting references to the removed memory objects to the new memories; and
translating the programmatic design into a hardware description of an integrated circuit using the modeled global memory, the data flow, and the scheduled memory access.

26. The machine-readable storage of claim 25, further comprising:
representing the programmatic design as a flow-graph wherein nodes of the flow-graph correspond to instructions of the programmatic design.

27. The machine-readable storage of claim 25, said identifying step further comprising:
creating a collection of instance objects representing each instance created in the programmatic design.

28. The machine-readable storage of claim 25, wherein said modeling step creates a map of the global memory, said map containing field variables for each instance in the programmatic design.

29. The machine-readable storage of claim 28, wherein said translating step translates the map of the global memory into the hardware description, wherein the hardware description conforms to a synthesizable hardware description language specification.

30. The machine-readable storage of claim 28, said scheduling step comprising:
creating a memory structure according to the map of the global memory.

31. The machine-readable storage of claim 30, said scheduling step comprising:
initializing each location in the memory structure with initialization values specified in the map of the global memory.

32. The machine-readable storage of claim 31, said scheduling step comprising:
creating a hardware description of arbitration logic, wherein the arbitration logic is configured to allow a single access to the memory per access port.

33. The machine-readable storage of claim 32, said scheduling step comprising:
creating synthesizable data flows between field read and write instructions of the programmatic design and the address generation logic.

34. The machine-readable storage of claim 33, said scheduling step comprising:
creating synthesizable data flows between field read and write instructions of the programmatic design and the arbitration logic.

35. The machine-readable storage of claim 31, said scheduling step comprising:
creating a hardware description of address generation logic, wherein the address generation logic is configured to transform a base address and an offset value into a single address for accessing the memory structure.

36. The machine-readable storage of claim 28, said modeling step further comprising:
identifying target fields of the programmatic design; and
determining whether access to the target fields is read or write access, and whether an accessing instruction of the target fields is resolvable.

37. The machine-readable storage of claim 36, said modeling step further comprising:
regenerating the map of the global memory.

38. The machine-readable storage of claim 25, said determining step further comprising:
identifying which instances are targeted by object reference instructions in the programmatic design.

39. The machine-readable storage of claim 25, wherein said memory objects are selected from the group consisting of fields, static fields, and arrays.

40. The machine-readable storage of claim 25, said scheduling step further comprising:
determining whether a resource of the programmatic design is accessed by more than one instruction per clock cycle.

41. The machine-readable storage of claim 40, wherein each said resource is selected from the group consisting of the global memory, an optimized memory, a static field register, a field, and an array.

42. The machine-readable storage of claim 25, said modeling step further comprising:
identifying as a first type read-only field each read-only field having a constant value and fully determinate accesses to the read-only field; and
replacing each memory access to a first type read-only field with the constant value in the first type read-only field.

43. The machine-readable storage of claim 42, further comprising:
representing the constant values with symbolic constants.

44. The machine-readable storage of claim 42, further comprising:
removing the read-only fields from the modeled global memory.

45. The machine-readable storage of claim 25, said modeling step further comprising:

identifying memory write accesses to fields which have been determined to be write-only fields;

removing write access to the write-only fields; and configuring data flows to account for the removed write accesses.

46. The machine-readable storage of claim 45, further comprising:

removing the write-only fields from the modeled global memory.

47. The machine-readable storage of claim 25, said scheduling step further comprising:

decomposing portions of the modeled global memory into parallel, independent registers to allow multiple accesses per cycle.

48. The machine-readable storage of claim 47, said scheduling step further comprising:

replacing the data flows of the decomposed memory with direct connections from a data source to a data consumer if both the data source and the data consumer are fully determinate.

49. An apparatus for designing an integrated circuit using a general purpose programming language comprising:

means for identifying a number of instances of each class allocated in a programmatic design implemented using the general purpose programming language;

means for modeling a global memory of the programmatic design;

means for determining a data flow between the modeled global memory and instructions of the programmatic design which access object fields;

means for scheduling access to the modeled global memory, including means for identifying at least one memory object, representing an instance, which is determined when the programmatic design is compiled, means for removing the identified memory objects from the global memory, means for creating a new memory for each of the memory objects removed from the global memory, and means for reconnecting references to the removed memory objects to the new memories; and means for translating the programmatic design into a hardware description of the integrated circuit using the modeled global memory, the data flow, and the scheduled memory access.

* * * * *